(12) United States Patent
Yang et al.

(10) Patent No.: US 12,507,604 B2
(45) Date of Patent: Dec. 23, 2025

(54) SEMICONDUCTOR MEMORY DEVICE AND FABRICATION METHOD THEREOF

(71) Applicant: UNITED MICROELECTRONICS CORP., Hsin-Chu (TW)

(72) Inventors: Po-Yu Yang, Hsinchu (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 424 days.

(21) Appl. No.: 17/673,812

(22) Filed: Feb. 17, 2022

(65) Prior Publication Data

US 2023/0240161 A1 Jul. 27, 2023

(30) Foreign Application Priority Data

Jan. 26, 2022 (CN) .......................... 202210092678.1

(51) Int. Cl.
*H10N 70/00* (2023.01)
*H10B 63/00* (2023.01)
*H10N 70/20* (2023.01)

(52) U.S. Cl.
CPC ......... *H10N 70/8418* (2023.02); *H10B 63/30* (2023.02); *H10N 70/011* (2023.02); *H10N 70/24* (2023.02); *H10N 70/826* (2023.02); *H10N 70/8833* (2023.02)

(58) Field of Classification Search
CPC .. H10N 70/826; H10N 70/8833; H10N 70/24; H10N 70/011; H10N 70/20; H10N 70/063; H10N 70/841–8418; H10N 70/821–828; H10N 70/06; H10B 63/30
See application file for complete search history.

(56) References Cited

U.S. PATENT DOCUMENTS

| 6,147,395 A * | 11/2000 | Gilgen | H10N 70/8828 257/50 |
| 7,960,226 B2 | 6/2011 | Block | |
| 9,054,255 B2 | 6/2015 | Swanson | |
| 10,147,875 B1 * | 12/2018 | Hansen | H10B 61/10 |
| 11,049,904 B1 | 6/2021 | Huang | |
| 2003/0189200 A1 * | 10/2003 | Lee | H10N 70/011 257/1 |
| 2010/0072450 A1 * | 3/2010 | Son | H10N 70/231 257/E47.001 |
| 2012/0241712 A1 * | 9/2012 | Cai | H10N 70/011 257/E21.52 |
| 2013/0037776 A1 * | 2/2013 | Nishi | H10N 70/245 257/3 |
| 2016/0104838 A1 * | 4/2016 | Park | H10N 70/011 257/4 |

(Continued)

*Primary Examiner* — Matthew C Landau
*Assistant Examiner* — David W Ward
(74) *Attorney, Agent, or Firm* — Winston Hsu

(57) ABSTRACT

A semiconductor memory device includes a substrate and a transistor disposed on the substrate. The transistor includes a source doped region, a drain doped region, a channel region, and a gate over the channel region. A data storage region is in proximity to the transistor and recessed into the substrate. The data storage region includes a ridge and a V-shaped groove. A bottom electrode layer conformally covers the ridge and V-shaped groove within the data storage region. A resistive-switching layer conformally covers the bottom electrode layer. A top electrode layer covers the resistive-switching layer.

9 Claims, 7 Drawing Sheets

(56) References Cited

U.S. PATENT DOCUMENTS

| | | | |
|---|---|---|---|
| 2016/0315256 A1* | 10/2016 | Ge | H10N 70/821 |
| 2019/0115394 A1* | 4/2019 | Liu | H10N 70/021 |
| 2019/0288201 A1* | 9/2019 | Sun | H10N 70/24 |
| 2020/0006650 A1* | 1/2020 | Wang | H10N 70/8416 |
| 2020/0136035 A1* | 4/2020 | Cheng | H10N 70/826 |
| 2021/0202578 A1* | 7/2021 | Huang | H10D 62/021 |
| 2022/0393105 A1* | 12/2022 | Leng | H10N 70/245 |

* cited by examiner

SEMICONDUCTOR MEMORY DEVICE AND FABRICATION METHOD THEREOF

BACKGROUND OF THE INVENTION

1. Field of the Invention

The present invention relates to the field of semiconductor technology, in particular, to a resistive random access memory (RRAM) device and a manufacturing method thereof.

2. Description of the Prior Art

Resistive RAM (RRAM) is a general name for two-terminal reprogrammable devices that can be set to either a low or high resistance state. RRAM generally consists of a dielectric layer disposed between two electrodes. Some types of RRAM conduct by forming a distinct filament in a limited area of the dielectric. Other types of RRAM conduct by changing the properties of the dielectric throughout its area.

RRAM stores data by using the variable resistance characteristic of a dielectric layer interposed between two electrodes. Such dielectric layer, as a resistive layer, is normally insulating but can be made to be conductive through a filament or conduction path formed after application of a sufficiently high voltage, i.e. through a forming process. The conduction path formation can arise from different mechanisms, including defects, metal migration, etc. Once the filament is formed, it may be reset (i.e. broken, resulting in high resistance) or set (i.e. re-formed, resulting in lower resistance) by an appropriately applied voltage.

Typically, RRAM structure has a vertical configuration with a single transistor and a single resistor. Because a large current is required, the size of the memory cell is affected by the transistor. In addition, the RRAM structure requires the bottom electrode, the resistive-switching layer, and the top electrode to be fabricated in the memory area. As a result, there is an additional inter-metal dielectric thickness in the memory region relative to the peripheral circuit region, which leads to low-k layer gap fill problem.

SUMMARY OF THE INVENTION

It is one object of the present invention to provide a semiconductor memory device and a manufacturing method thereof in order to solve the above-mentioned deficiencies or shortcomings of the prior art.

One aspect of the invention provides a semiconductor memory device including a substrate; a transistor disposed on the substrate, wherein the transistor comprises a source doped region disposed in the substrate; a drain doped region disposed in the substrate and spaced apart from the source doped region; a channel region in the substrate between the source doped region and the drain doped region; and a gate over the channel region; a data storage region in proximity to the transistor and recessed into the substrate, wherein the data storage region comprises at least one ridge and at least one V-shaped groove; a bottom electrode layer conformally covering the at least one ridge and at least one V-shaped groove within the data storage region; a resistive-switching layer conformally covering the bottom electrode layer; and a top electrode layer covering the resistive-switching layer.

According to some embodiments, the semiconductor memory device further includes a diffusion region surrounding the bottom electrode layer. The drain doped region is merged with the diffusion region.

According to some embodiments, the semiconductor memory device further includes a metal silicide layer between the substrate and the bottom electrode layer.

According to some embodiments, the metal silicide layer comprises nickel silicide.

According to some embodiments, the at least one V-shaped groove is completely filled with the bottom electrode layer, the resistive-switching layer, and the top electrode layer.

According to some embodiments, the bottom electrode layer comprises titanium nitride or tantalum nitride.

According to some embodiments, the resistive-switching layer comprises metal oxide.

According to some embodiments, the resistive-switching layer comprises hafnium oxide, tantalum oxide, titanium oxide or aluminum oxide.

According to some embodiments, the top electrode layer comprises titanium nitride or tantalum nitride.

According to some embodiments, the top electrode layer comprises tungsten.

Another aspect of the invention provides a method for forming a semiconductor memory device. A substrate is provided. A transistor is formed on the substrate. The transistor includes a source doped region disposed in the substrate; a drain doped region disposed in the substrate and spaced apart from the source doped region; a channel region in the substrate between the source doped region and the drain doped region; and a gate over the channel region. A data storage region is disposed in proximity to the transistor and recessed into the substrate. The data storage region comprises at least one ridge and at least one V-shaped groove. A bottom electrode layer is conformally deposited over the at least one ridge and at least one V-shaped groove within the data storage region. A resistive-switching layer is conformally formed on the bottom electrode layer. A top electrode layer is formed on the resistive-switching layer.

According to some embodiments, a diffusion region surrounding the bottom electrode layer is formed. The drain doped region is merged with the diffusion region.

According to some embodiments, a metal silicide layer is formed between the substrate and the bottom electrode layer.

According to some embodiments, the metal silicide layer comprises nickel silicide.

According to some embodiments, the at least one V-shaped groove is completely filled with the bottom electrode layer, the resistive-switching layer, and the top electrode layer.

According to some embodiments, the bottom electrode layer comprises titanium nitride or tantalum nitride.

According to some embodiments, the resistive-switching layer comprises metal oxide.

According to some embodiments, the resistive-switching layer comprises hafnium oxide, tantalum oxide, titanium oxide or aluminum oxide.

According to some embodiments, the top electrode layer comprises titanium nitride or tantalum nitride.

According to some embodiments, the top electrode layer comprises tungsten.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
FIG. 1 to FIG. 13 are schematic diagrams illustrating a method of forming a semiconductor memory device according to an embodiment of the present invention.
Figure 1:
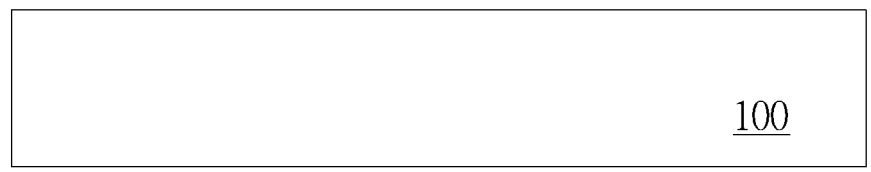

Please refer to FIG. 1 to FIG. 13, which are schematic diagrams of a method for forming a semiconductor memory device according to an embodiment of the present invention. As shown in FIG. 1, first, a substrate 100 is provided, for example, a semiconductor substrate such as a silicon substrate. According to an embodiment of the present invention, the substrate 100 includes a transistor forming region TR and a data storage region DR. The data storage region DR is adjacent to the transistor forming region TR.

Figure 2:
Figure 2:
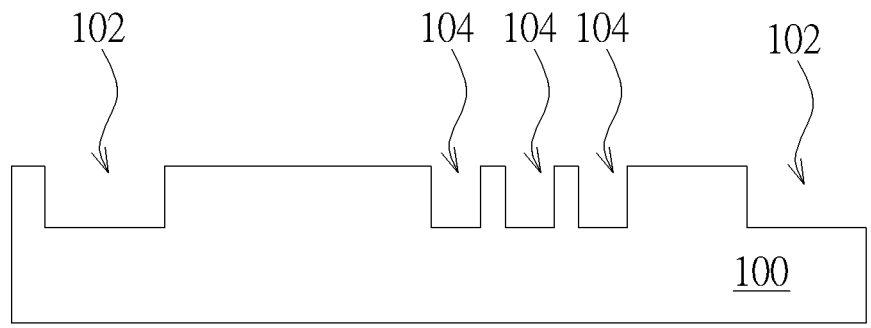

As shown in FIG. 2, next, a lithography process and an etching process are performed to form isolation trenches 102 on the surface of the substrate 100, which define an active area, and several grooves 104 are formed in the data storage region DR.

Figure 3:
Figure 3:
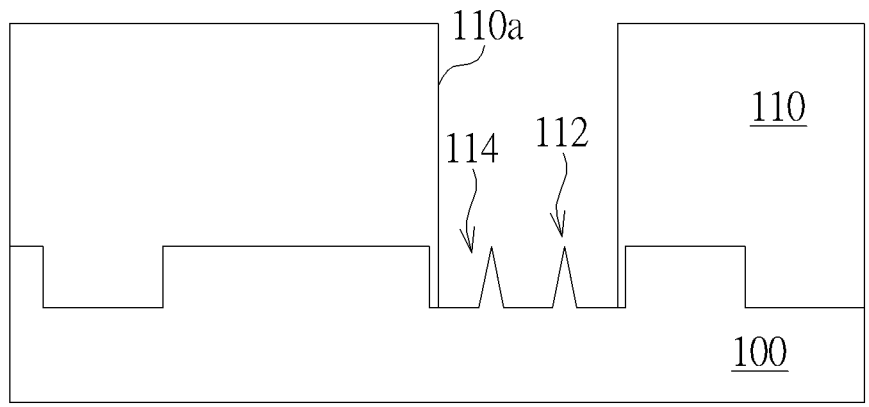

As shown in FIG. 3, next, a patterned photoresist layer 110 is formed on the substrate 100. The patterned photoresist layer 110 includes an opening 110a exposing the grooves 104 in the data storage region DR. Then, using a wet etching method, the surface of the grooves 104 in the data storage region DR is etched to form ridges 112 and V-shaped grooves 114.

The aforementioned wet etching method can be performed using tetramethylammonium hydroxide (TMAH) to etch the substrate 100 between the grooves 104 in the data storage region DR into a structure having a spire-shaped or triangular profile.

Figure 4:
Figure 4:
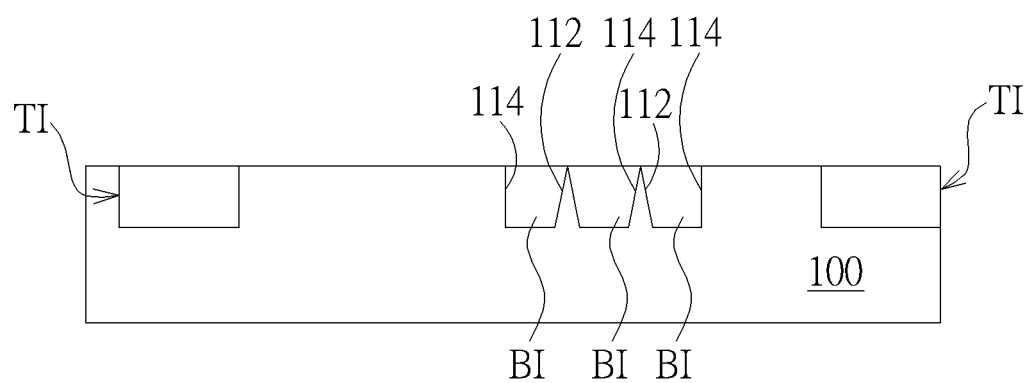

As shown in FIG. 4, the patterned photoresist layer 110 is then removed. Subsequently, a dielectric layer, for example, a silicon oxide layer, is deposited on the substrate 100 in a blanket manner. A chemical mechanical polishing (CMP) process is then used for planarization to form a trench isolation structure TI and a buried oxide layer BI filled into the V-shaped grooves 114 in the data storage region DR.

Figure 5:
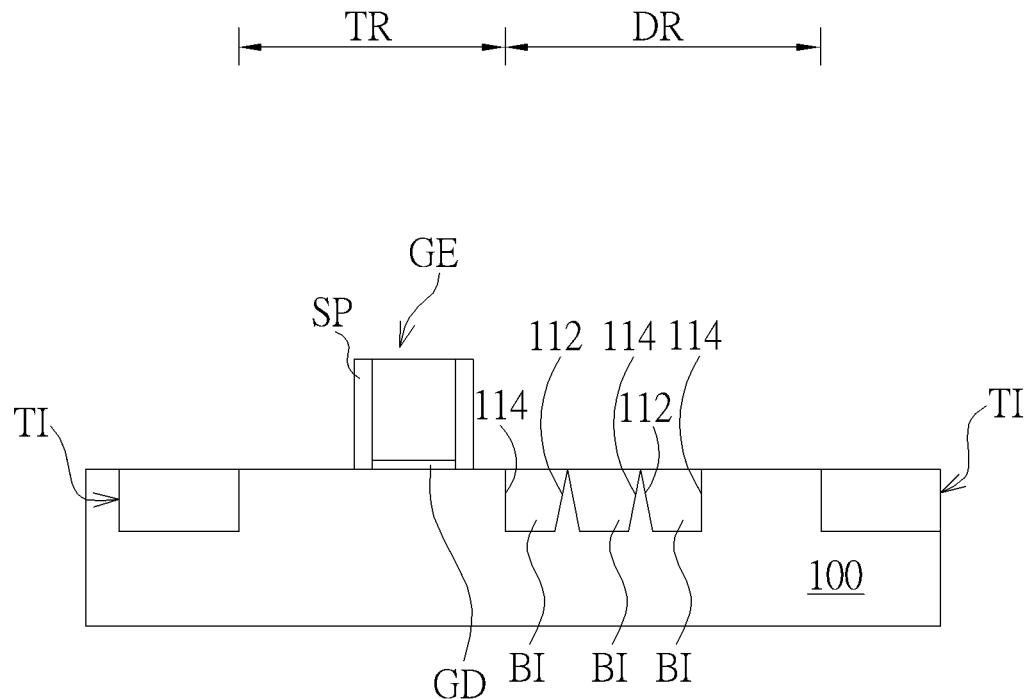

As shown in FIG. 5, a gate electrode GE, for example, a polysilicon gate is formed on the substrate 100 in the transistor forming region TR. According to an embodiment of the present invention, the spacer SP may be formed on the sidewall of the gate electrode GE. According to an embodiment of the present invention, a gate dielectric layer GD may be formed between the gate electrode GE and the substrate 100. According to an embodiment of the present invention, the gate electrode GE is adjacent to the data storage region DR.

Figure 6:
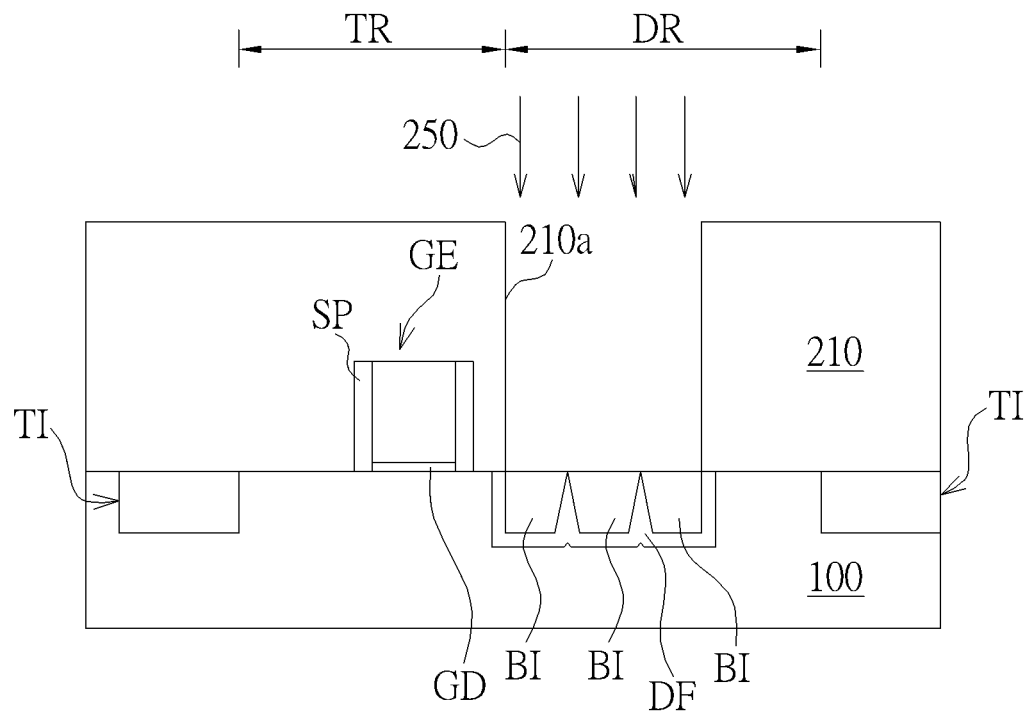

As shown in FIG. 6, next, a patterned photoresist layer 210 is formed on the substrate 100. The patterned photoresist layer 210 includes an opening 210a that exposes the buried oxide layer BI in the data storage region DR. An ion implantation process 250 is then performed, and dopants, such as N-type dopants, are implanted into the substrate 100 through the opening 210a. Am annealing process is then performed to form a diffusion region DF, such as an N⁺ diffusion region.

Figure 7:
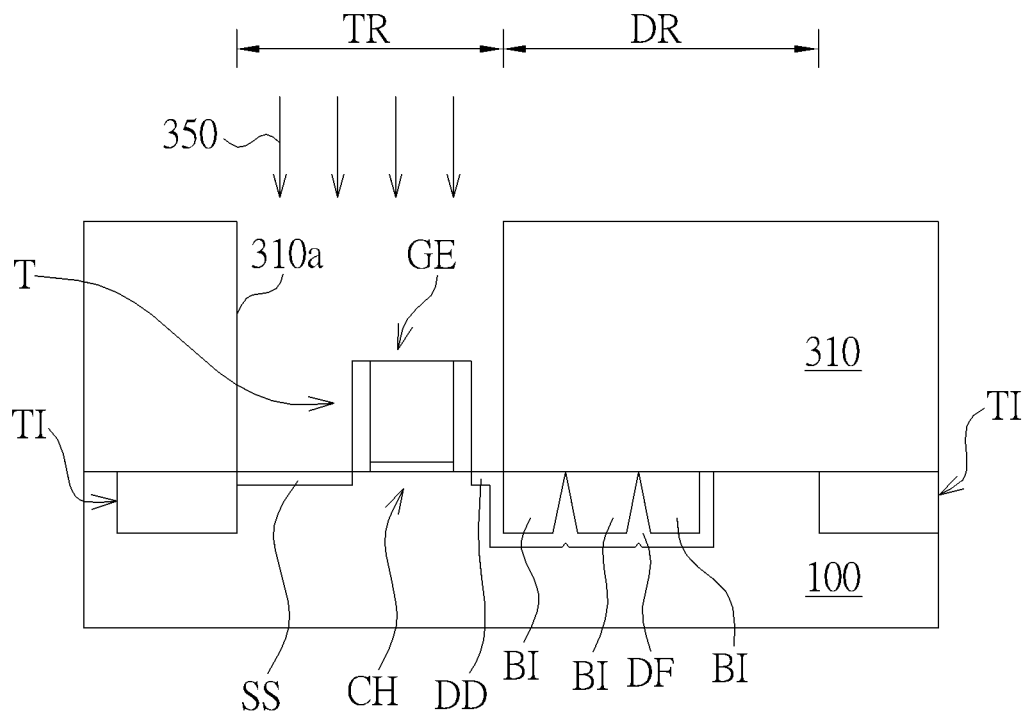

As shown in FIG. 7, next, a patterned photoresist layer 310 is formed on the substrate 100. The patterned photoresist layer 310 includes an opening 310a that exposes the transistor forming region TR and the gate electrode GE located in the transistor forming region TR.

An ion implantation process 350 is then performed to form a source doped region SS and a drain doped region DD in the substrate 100 on both sides of the gate electrode GE, respectively, so that the fabrication of the transistor T is completed. A channel region CH is formed in the substrate 100 between the source doped region SS and the drain doped region DD of the transistor T. The gate electrode GE is located above the channel region CH. According to an embodiment of the present invention, the source doped region SS and the drain doped region DD may be N⁺ doped regions. According to an embodiment of the present invention, the drain doped region DD and the diffusion region DF are connected and merged together.

Figure 8:
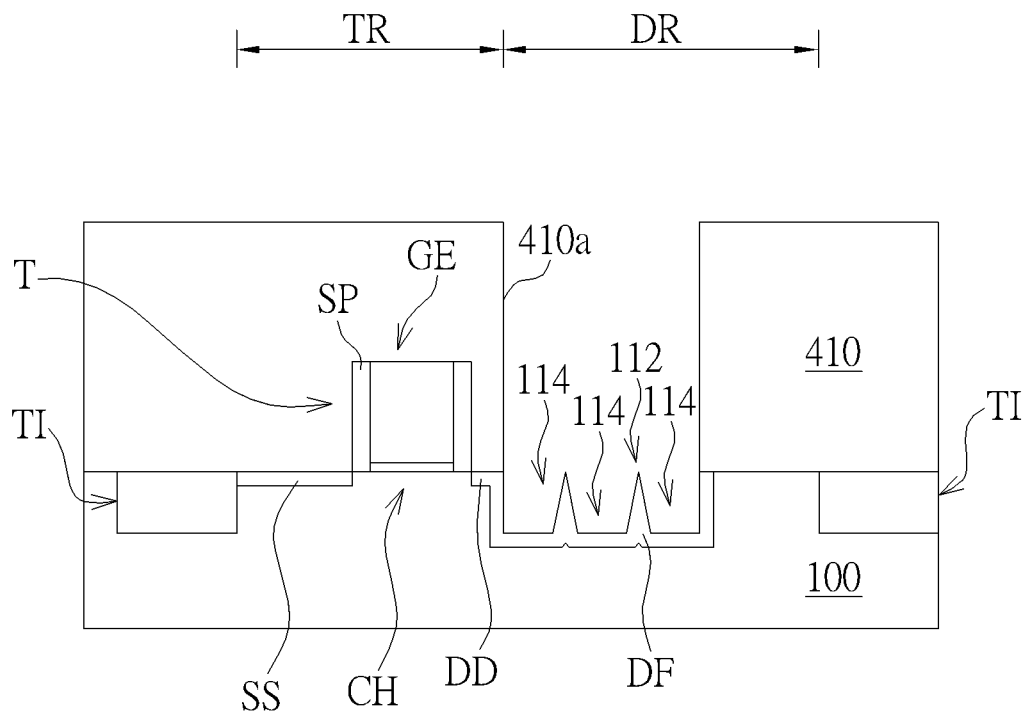

As shown in FIG. 8, next, a patterned photoresist layer 410 is formed on the substrate 100. The patterned photoresist layer 410 includes an opening 410a that exposes the buried oxide layer BI in the data storage region DR. Next, an etching process, such as dry etching or wet etching, is performed to remove the buried oxide layer BI and the ridges 112 and the V-shaped grooves 114 are exposed.

Figure 9:
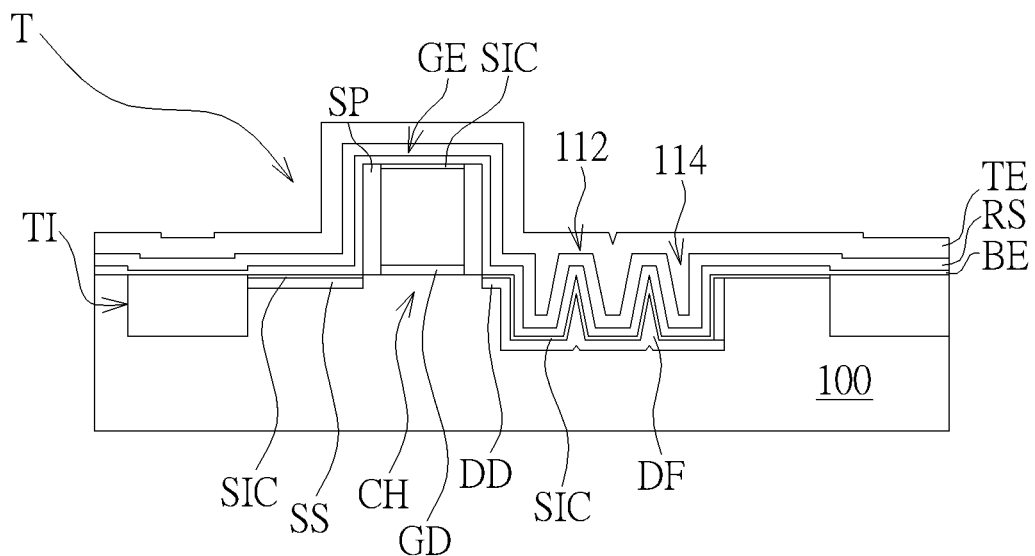

As shown in FIG. 9, next, a metal silicide layer SIC may be formed on the gate electrode GE, the source doped region SS, the drain doped region DD, and the data storage region DR. According to an embodiment of the present invention, for example, the metal silicide layer SIC may include nickel silicide, but is not limited thereto. The metal silicide layer SIC can be formed using a self-alignment method.

A bottom electrode layer BE is conformally deposited on the ridges 112 and the V-shaped grooves 114 in the data storage region DR. Then, a resistive-switching layer RS is conformally formed on the bottom electrode layer BE. Next, a top electrode layer TE is formed on the resistive-switching layer RS. According to an embodiment of the present invention, the V-shaped grooves 114 are completely filled by the bottom electrode layer BE, the resistive-switching layer RS, and the top electrode layer TE.

According to an embodiment of the present invention, the bottom electrode layer BE may include titanium nitride or tantalum nitride. According to an embodiment of the present invention, the resistive-switching layer RS may include a metal oxide. According to an embodiment of the present invention, for example, the resistive-switching layer RS may include hafnium oxide, tantalum oxide, titanium oxide, or aluminum oxide. According to an embodiment of the present invention, the top electrode layer TE may include titanium nitride or tantalum nitride. According to another embodiment of the present invention, the top electrode layer TE may include tungsten.

Figure 10:
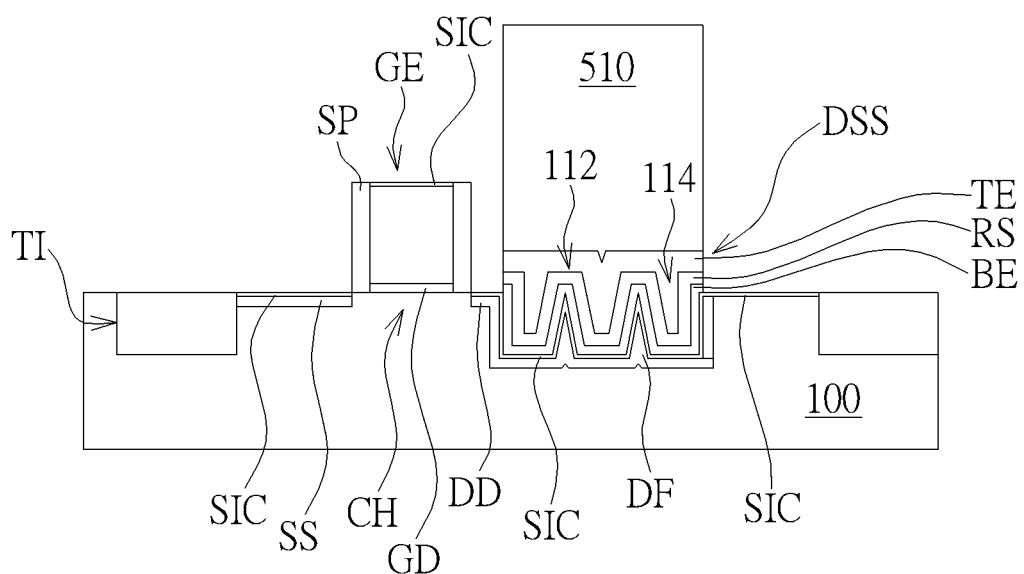

As shown in FIG. 10, next, a patterned photoresist layer 510 is formed on the substrate 100 in the data storage area DR to define the location and pattern of a data storage structure. Then, an etching process such as an anisotropic dry etching process is performed to etch away the top electrode layer TE, the resistive-switching layer RS and the bottom electrode layer BE not covered by the patterned photoresist layer 510, thereby forming the data storage structure DSS. According to an embodiment of the present invention, the diffusion region DF surrounds the bottom electrode layer BE of the data storage structure DSS.

Figure 11:
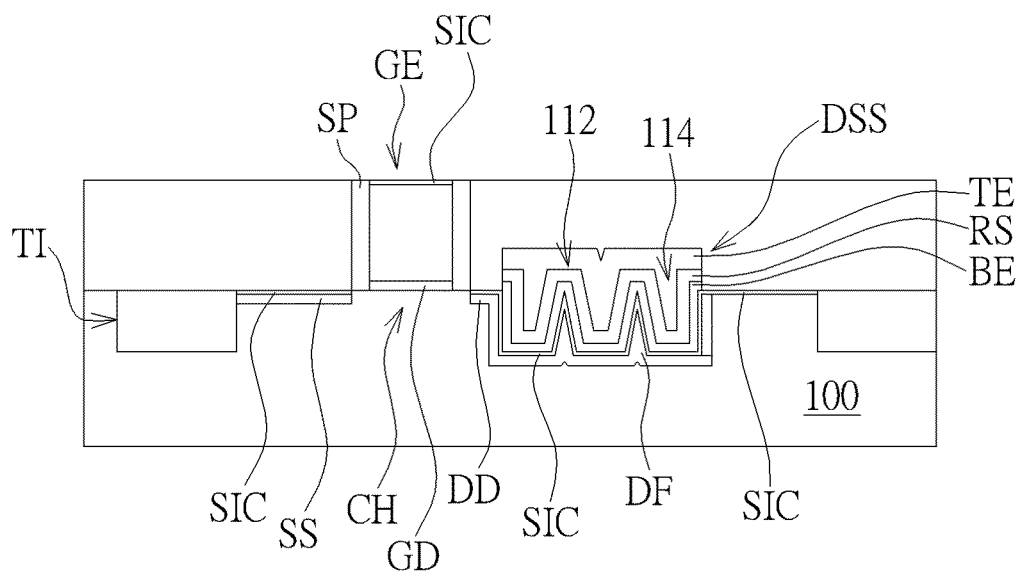
Figure 12:
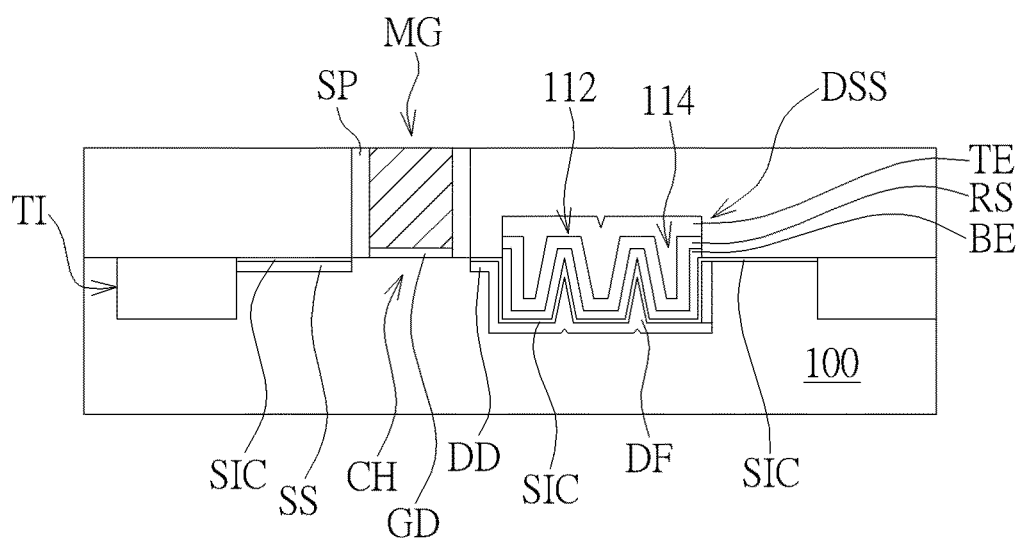
Figure 13:
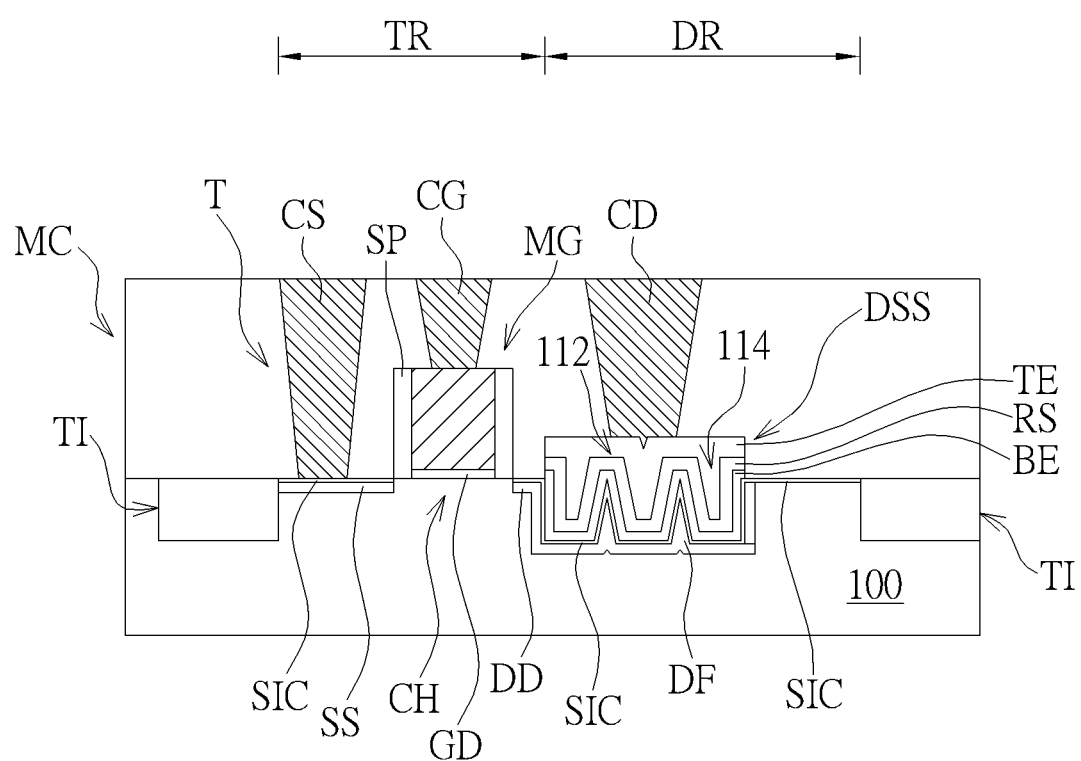

As shown in FIG. 11 to FIG. 13, subsequent steps include deposition and planarization of the dielectric layer IL (FIG. 11), replacement metal gate (RMG) process (FIG. 12), and contact plug fabrication (FIG. 13). As shown in FIG. 11, a chemical vapor deposition (CVD) process is first performed, and a dielectric layer IL, such as a silicon oxide layer, is deposited on the surface of the substrate 100 in a blanket manner. Then, a chemical mechanical polishing (CMP) process is performed to planarize the dielectric layer IL until the gate electrode GE is exposed. Subsequently, as shown in FIG. 12, a metal gate replacement process is performed to form a metal gate MG. As shown in FIG. 13, contact plugs CS, CG, and CD are formed in the dielectric layer IL, which are electrically connected to the source doped region SS, gate electrode GE, and drain doped region DD, respectively, thereby forming a semiconductor memory device MC.

Structurally, as shown in FIG. 13, the semiconductor memory device MC of the present invention includes a substrate 100 and a transistor T disposed on the substrate 100. The transistor T includes a source doped region SS disposed in the substrate 100, a drain doped region DD disposed in the substrate 100 and spaced apart from the source doped region SS, a channel region CH in the substrate 100 between the source doped region SS and the drain doped regions DD, and a metal gate MG above the channel region CH. A data storage region DR is adjacent to the transistor T and is recessed into the substrate 100.

According to an embodiment of the present invention, the data storage region DR includes at least one ridge 112 and at least one V-shaped groove 114. According to an embodiment of the present invention, the bottom electrode layer BE conformally covers the ridges 112 and the V-shaped grooves 114 in the data storage region DR. According to an embodiment of the present invention, the resistive-switching layer RS conformally covers the bottom electrode layer BE. According to an embodiment of the present invention, the top electrode layer TE covers the resistive-switching layer RS.

According to an embodiment of the present invention, the semiconductor memory device MC further includes a diffusion region DF surrounding the bottom electrode layer BE, wherein the drain doped region DD is merged with the diffusion region DF.

According to an embodiment of the present invention, the semiconductor memory device MC further includes a metal silicide layer SIC located between the substrate 100 and the bottom electrode layer BE. According to an embodiment of the present invention, the metal silicide layer includes nickel silicide.

According to an embodiment of the present invention, the V-shaped grooves 114 are completely filled by the bottom electrode layer BE, the resistive-switching layer RS, and the top electrode layer TE. According to an embodiment of the present invention, the bottom electrode layer BE includes titanium nitride or tantalum nitride. According to an embodiment of the present invention, the resistive-switching layer RS includes a metal oxide. According to an embodiment of the present invention, the resistive-switching layer RS includes hafnium oxide, tantalum oxide, titanium oxide or aluminum oxide. According to an embodiment of the present invention, the top electrode layer TE includes titanium nitride or tantalum nitride. According to an embodiment of the present invention, the top electrode layer TE includes tungsten.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor memory device, comprising:
providing a substrate;
forming a transistor on the substrate, wherein the transistor comprises a source doped region disposed in the substrate; a drain doped region disposed in the substrate and spaced apart from the source doped region; a channel region in the substrate between the source doped region and the drain doped region; and a gate over the channel region;
performing a two-stage etching step to form a data storage region in proximity to the transistor and recessed into the substrate, wherein the data storage region comprises multiple ridges and at least one V-shaped groove between the multiple ridges, wherein an apex angle of each of the multiple ridges is an acute angle, wherein the two-stage etching step comprises: (1) performing a first etching process to form multiple grooves and isolation trenches in the substrate; (2) after performing the first etching process, forming a patterned photoresist layer on the substrate masking the isolation trench, the patterned photoresist layer including an opening exposing the multiple grooves in the data storage region; (3) after forming the patterned photoresist layer, performing a second etching process to etch a surface of the multiple grooves through the opening thereby forming the multiple ridges and the at least one V-shaped groove between the multiple ridges, and (4) removing the patterned photoresist layer, wherein the second etching process is a wet etching process;
filling the isolation trenches with a dielectric layer;
conformally depositing a bottom electrode layer over the multiple ridges and at least one V-shaped groove within the data storage region;
forming a metal silicide layer between the substrate and the bottom electrode layer, wherein the metal silicide layer extends from the data storage region onto a top surface of the drain doped region;
conformally forming a resistive-switching layer on the bottom electrode layer; and
forming a top electrode layer on the resistive-switching layer.

2. The method according to claim 1 further comprising:
forming a diffusion region surrounding the bottom electrode layer, wherein the drain doped region is merged with the diffusion region.

3. The method according to claim 1, wherein the metal silicide layer comprises nickel silicide.

4. The method according to claim 1, wherein the at least one V-shaped groove is completely filled with the bottom electrode layer, the resistive-switching layer, and the top electrode layer.

5. The method according to claim 1, wherein the bottom electrode layer comprises titanium nitride or tantalum nitride.

6. The method according to claim 1, wherein the resistive-switching layer comprises metal oxide.

7. The method according to claim 1, wherein the resistive-switching layer comprises hafnium oxide, tantalum oxide, titanium oxide or aluminum oxide.

8. The method according to claim 1, wherein the top electrode layer comprises titanium nitride or tantalum nitride.

9. The method according to claim 1, wherein the top electrode layer comprises tungsten.

\* \* \* \* \*